(12) United States Patent
Colli et al.

(10) Patent No.: US 11,852,536 B2
(45) Date of Patent: Dec. 26, 2023

(54) MULTISPECTRAL PHOTODETECTOR ARRAY

(71) Applicant: EMBERION OY, Espoo (FI)

(72) Inventors: Alan Colli, Cambridge (GB); Alexander Bessonov, Cambridge (GB)

(73) Assignee: EMBERION OY, Espoo (FI)

( * ) Notice: Subject to any disclaimer, the term of this patent is extended or adjusted under 35 U.S.C. 154(b) by 456 days.

(21) Appl. No.: 17/283,790

(22) PCT Filed: Oct. 11, 2019

(86) PCT No.: PCT/FI2019/050728
§ 371 (c)(1),
(2) Date: Apr. 8, 2021

(87) PCT Pub. No.: WO2020/074785
PCT Pub. Date: Apr. 16, 2020

(65) Prior Publication Data
US 2021/0381894 A1 Dec. 9, 2021

(30) Foreign Application Priority Data

Oct. 11, 2018 (GB) ..................................... 1816609

(51) Int. Cl.
*G01J 3/36* (2006.01)
*G01J 5/10* (2006.01)
(Continued)

(52) U.S. Cl.
CPC . *G01J 3/36* (2013.01); *G01J 5/10* (2013.01); *H01L 27/14652* (2013.01); *H01L 31/18* (2013.01)

(58) Field of Classification Search
CPC .... G01J 3/36; G01J 5/10; G01J 3/2803; G01J 5/0801; G01J 5/0846; G01J 5/34;
(Continued)

(56) References Cited

U.S. PATENT DOCUMENTS

| 5,808,350 A | 9/1998 | Jack et al. |
| 8,916,825 B1 | 12/2014 | Egerton et al. |

(Continued)

FOREIGN PATENT DOCUMENTS

| EP | 3015833 A1 | 5/2016 |
| EP | 3206235 A1 | 8/2017 |

(Continued)

OTHER PUBLICATIONS

International Search Report and Written Opinion dated Jan. 15, 2020 corresponding to International Patent Application No. PCT/FI2019/050728.

(Continued)

*Primary Examiner* — Mohammed R Alam
(74) *Attorney, Agent, or Firm* — SQUIRE PATTON BOGGS (US) LLP

(57) ABSTRACT

A photodetector array comprising at least one first sensor and at least one second sensor on the horizontal surface of the array substrate. The at least one first sensor is sensitive to radiation in a first wavelength range which comprises long-wavelength infrared wavelengths, and the at least one second sensor is sensitive to radiation in a second wavelength range which comprises wavelengths shorter than long-wavelength infrared. The array substrate comprises a vertical cavity on its horizontal surface, and the first sensor comprises a layer of pyroelectric material (65) which extends horizontally across the vertical cavity in the first area. A first part of a layer of two-dimensional layered material at least partly covers the layer of pyroelectric material (65), and a second part of the layer of two-dimensional layered material at least partly covers the foundation of the second sensor.

10 Claims, 11 Drawing Sheets

(51) Int. Cl.
*H01L 27/146* (2006.01)
*H01L 31/18* (2006.01)

(58) Field of Classification Search
CPC ......... G01J 2005/345; H01L 27/14652; H01L 31/18; H01L 31/028; H01L 31/036; H01L 31/09; H01L 31/1136; H01L 27/1446
See application file for complete search history.

(56) References Cited

U.S. PATENT DOCUMENTS

| | | |
|---|---|---|
| 9,196,766 B1 | 11/2015 | Egerton et al. |
| 2006/0043297 A1* | 3/2006 | Ouvrier-Buffet ......... G01J 5/04 250/339.05 |
| 2013/0032782 A1 | 2/2013 | Gerasimos et al. |
| 2014/0085482 A1 | 3/2014 | Teich et al. |
| 2014/0231635 A1 | 8/2014 | Kerness et al. |
| 2014/0264270 A1 | 9/2014 | Dutta |

FOREIGN PATENT DOCUMENTS

| | | |
|---|---|---|
| FR | 2 999 338 A1 | 6/2014 |
| JP | S 5932828 A | 2/1984 |
| JP | H 01136035 A | 5/1989 |
| JP | 2006-343229 A | 12/2006 |
| WO | WO 2008/127297 A2 | 10/2008 |

OTHER PUBLICATIONS

GB Search Report under Section 17(5) dated Mar. 8, 2019 corresponding to GB application No. GB1816609.0.
European Search Report dated May 13, 2022 corresponding to European Patent Application No. 19870156.

* cited by examiner

MULTISPECTRAL PHOTODETECTOR ARRAY

FIELD OF THE DISCLOSURE

The present disclosure relates to photodetectors, and particularly to photodetectors where two-dimensional layered materials are used as electrically active sensor components. The present disclosure further concerns photodetector arrays that comprise at least one sensor for detecting long-wavelength infrared radiation, and at least one sensor for detecting radiation at shorter wavelengths.

BACKGROUND OF THE DISCLOSURE

Detection of radiation at ultraviolet (UV), visible (VIS), near-infrared (NIR), short-wavelength infrared (SWIR), mid-wave infrared (MWIR) and long-wavelength infrared (LWIR) wavelengths is increasingly important for applications in astronomy, healthcare, smart energy systems, security, pollution monitoring, fire sensing, automotive, night vision systems, and motion tracking. According to a conventional classification which will be applied in this disclosure, UV includes wavelength shorter than 0.4 μm, VIS includes wavelengths from 0.4 μm to 0.7 μm, NIR the range 0.7 μm-1 μm, SWIR 1 μm-3 μm, MWIR 3-5 μm and LWIR above 7 μm. The limits of these ranges are not absolute and other classifications are also possible.

Document US20140264270 discloses a broadband image sensor where a first photodetector array, suitable for detecting VIS, NIR, and SWIR wavelengths, is combined with a second photodetector array for detecting MWIR and LWIR wavelengths. However, these two arrays are prepared on separate substrates and have to be electrically interconnected in a complex arrangement. It would be more advantageous to utilize only one substrate for the multispectral photodetector array.

Visible and infrared photodetectors that utilize two-dimensional materials have recently been demonstrated. Document US20130032782 discloses a field-effect transistor with a semiconducting photoactive layer adjacent to a two-dimensional graphene layer. Document EP3015833 discloses a bolometer where a field-effect transistor with a two-dimensional channel is capacitively coupled to a pyroelectric material.

BRIEF DESCRIPTION OF THE DISCLOSURE

An object of the present disclosure is to provide a method for manufacturing multispectral photodetector arrays and a corresponding photodetector apparatus which alleviate the above disadvantages.

The method and apparatus are characterized by what is stated in the independent claims. The preferred embodiments of the disclosure are disclosed in the dependent claims.

The disclosure is based on the idea of first preparing on a substrate a foundation for a thermal photodetector, and then preparing on the same substrate a foundation for a quantum photodetector. An advantage of the method described in this disclosure is that a single layer of two-dimensional layered material can be used to form electrically active transistor channels in both the thermal photodetector and the quantum photodetector.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
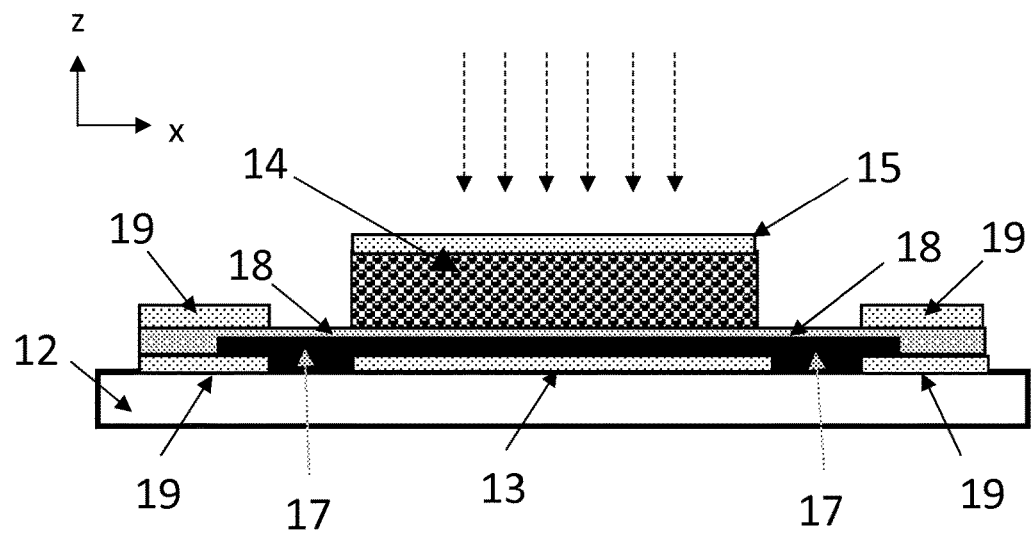
FIGS. 1-3 illustrate quantum photodetectors.

Quantum photodetectors which utilize two-dimensional layered materials (also referred to simply as two-dimensional materials) are typically used to detect electromagnetic radiation at UV, VIS, NIR and SWIR wavelengths. Field-effect phototransistors may, for example, comprise a semiconducting channel formed by a two-dimensional material. The conductivity of the channel is illumination-dependent. The absorption and spectral responsivity of such photodetectors can be increased by preparing an additional photoactive layer adjacent to the two-dimensional channel which is capable of absorbing more radiation and multiplying the number of charge-carriers released by radiation. The photoactive layer is typically semiconducting. By selecting a photoactive material with a suitable bandgap, the photodetector can be sensitized to a given wavelength band. With small-bandgap photoactive materials, the spectral responsivity of quantum photodetectors can be extended to MWIR wavelengths.

However, at LWIR wavelengths, where semiconductor bandgaps would have to be very small for photoexcitation to occur, the response signal from quantum photodetectors becomes noisy due to thermally excited charge carriers. Quantum photodetectors would need to be operated at cryogenic temperatures to measure LWIR radiation intensity reliably.

Thermal photodetectors such as bolometers can measure radiation intensity at LWIR wavelengths even at room temperature. Bolometers may, for example, comprise a pyroelectric material where illumination-dependent temperature changes accumulate charge near a surface. By utilizing antennas, the spectral responsivity of thermal photodetectors can also be extended to MWIR wavelengths. The spectral responsivity curve of a thermal photodetector configured for MWIR wavelengths may partly overlap with the corresponding curve for a quantum photodetector configured for MWIR wavelengths.

The photodetector arrays described in this disclosure may comprise some photodetectors that are capable of sensing radiation with a wavelength as short as 200 nm, and other photodetectors capable of sensing radiation with a wavelength as long as 20 μm, and further photodetectors capable of sensing radiation intermediate wavelengths between these two values.

This disclosure describes a method for preparing a photodetector array. The array comprises an array substrate with a horizontal surface, and at least one first sensor and at least one second sensor on the horizontal surface of the array substrate. The at least one first sensor is sensitive to radiation in a first wavelength range which comprises at least long-wavelength infrared. The at least one second sensor is sensitive to radiation in a second wavelength range which comprises wavelengths shorter than long-wavelength infrared. The at least one first sensor is a thermal photodetector and the at least one second sensor is a quantum photodetector. The method comprises the following steps:

a) etching a vertical cavity in at least one first area on the horizontal surface of the array substrate b) preparing the foundation of the thermal photodetector in the at least one first area on the horizontal surface of the array substrate, wherein the preparation comprises placing a layer of pyroelectric material over the vertical cavity in the first area, so that it extends horizontally across the cavity, c) preparing the foundation of the quantum photodetector in at least one second area of the horizontal surface of the array substrate, wherein the preparation comprises deposition of one or more of the following layers: a gate insulating layer, a photoactive semiconducting layer, a conductive gate electrode layer, d) depositing a layer of two-dimensional layered material on the horizontal surface of the array substrate so that it covers the foundation of the thermal photodetector at least in a part of each first area of the horizontal surface of the array substrate, and so that it covers the foundation of the quantum photodetector at least in a part of each second area of the horizontal surface of the array substrate, e) patterning the layer of two-dimensional layered material into at least two separate parts, so that one or more first parts of the layer of two-dimensional layered material cover at least a part of the foundation of the thermal photodetector, and one or more second parts of the layer of two-dimensional layered material cover at least a part of the foundation of the quantum photodetector, f) providing electrical connections to each first and second part of the two-dimensional layered material and depositing on each first part of the layer of two-dimensional material a top insulating layer, and depositing on each top insulating layer a top electrode layer which extends from a transistor area within the first area to an adjacent area within the first area, so that the top electrode layer is in direct contact with the layer of pyroelectric material in the adjacent area.

A corresponding photodetector array described in this disclosure comprises an array substrate with a horizontal surface, and at least one first sensor and at least one second sensor on the horizontal surface of the array substrate. The at least one first sensor is sensitive to radiation in a first wavelength range which comprises long-wavelength infrared wavelengths, and the at least one second sensor is sensitive to radiation in a second wavelength range which comprises wavelengths shorter than long-wavelength infrared. The at least one first sensor is a thermal photodetector and the at least one second sensor is a quantum photodetector.

The array substrate comprises a vertical cavity in a first area on its horizontal surface. The thermal photodetector comprises a layer of pyroelectric material which extends horizontally across the vertical cavity in the first area, and a first part of a layer of two-dimensional layered material which at least partly covers the layer of pyroelectric material. The thermal photodetector also comprises one or more electrical contact areas on the array substrate which provide electrical connections to the first part of a layer of two-dimensional material, and a top insulating layer on the first part of the layer of two-dimensional material. The thermal photodetector also comprises a top electrode layer on the top insulating layer. The top electrode layer extends from a transistor area within the first area to an adjacent area within the first area, where the top electrode layer is in direct contact with the layer of pyroelectric material.

The quantum photodetector comprises a foundation which includes at least one of the following layers on a second area of the horizontal surface of the array substrate: a gate insulating layer, a photoactive semiconducting layer, a conductive gate electrode layer. The quantum photodetector also comprises a second part of the layer of two-dimensional layered material which at least partly covers the foundation of the quantum photodetector, and one or more electrical contact areas on the array substrate which provide electrical connections to the second part of the layer of two-dimensional material.

In this disclosure, expressions such as "first area on the horizontal surface of the array substrate" or "contact areas on the array substrate" refer to the surface of the array substrate with all deposited layers included. For example, if layer A is the first layer deposited on the substrate in the first area, the top surface of layer A will then form the "horizontal surface of the array substrate" for the next layer. The same applies to any other layers that area subsequently deposited on the first area. In other words, foundations or contacts which area prepared on the "surface of the array substrate" or "on the array substrate" do not necessarily have to be in direct contact with the array substrate itself—there may be intervening layers that were deposited on the substrate before the foundations/contacts were prepared.

In this disclosure, terms such as "vertical" and "horizontal" do not imply anything about the orientation of the substrate when the device is manufactured, or when the device is in use. The device and the substrate may be oriented in any suitable direction during usage and manufacturing, for example sideways in such a manner that a plane which is in this disclosure referred to as "horizontal" becomes a vertical surface. In other words, the terms "horizontal" and "vertical" merely define two orthogonal directions. The horizontal direction is parallel to a main surface of the array substrate, and the vertical direction is normal to that main surface. In all figures of this disclosure, the horizontal device plane defined by the orientation of the array substrate is marked as an xy-plane and the vertical direction is indicated with the z-axis.

The second sensor may be sensitive to radiation in UV, VIS, NIR, SWIR and/or MWIR wavelength ranges. If the photodetector comprises more than one second sensors, some of these second sensors may for example be sensitive to the VIS wavelength range, others to UV, NIR or SWIR wavelength ranges. The photodetector array may comprise multiple sensors that are sensitive to the same wavelength range.

In this disclosure, the term "photodetector array" refers to a device which comprises multiple photodetectors on one array substrate. In some geometries where photodetectors are grouped into several areas on the substrate, it may be appropriate to say that several arrays are present on the same array substrate. The number of sensors on the array substrate is at least two and could be several thousands or tens of thousands. Each sensor may form one pixel in a photodetector array. Adjacent pixels may in that case be dedicated to measuring different wavelengths. Alternatively, if multiple thermal photodetectors and quantum photodetectors are present in the array, then each pair of an adjacent thermal photodetector and quantum photodetector may form one pixel. As described in this disclosure, the sensors which form the photodetector array may be sensitive to radiation of different wavelengths.

In this disclosure, the term "quantum photodetector" refers to a photodetector where incoming photons are absorbed in a light-sensitive semiconducting material where they release charge carriers. Some of these charge carriers can be separated before they recombine, and the resulting change in the electrical balance of the detector can be measured in an electrical circuit connected to the detector. The measured variable may, for example, be the source-drain current in a transistor, or the electric potential of an electrode. This variable can be made proportional to the intensity of the incident radiation. The channel may comprise a two-dimensional layered material.

FIG. 1 illustrates one example of a quantum photodetector. It may for example comprise a conductive gate electrode 13 on the surface of the array substrate 12, a gate insulating layer 17 which covers the gate electrode 13, conductive source and drain contacts 19 on the surface of the array substrate 12, and a channel 18 formed by a layer of two-dimensional material such as graphene. The source and drain contacts 19 may cover the gate insulating layer, or they may, as in FIG. 1, be deposited beyond the second area (defined by the gate electrode 13) if the graphene channel 18 extends outside of the second area.

The graphene channel 18 may be deposited before or after the source and drain contacts 19, or one set of source and drain contacts may deposited before the channel and another set after, as in FIG. 1. A semiconducting photoactive layer 14, which may be a layer of semiconducting nanocrystals, may optionally be deposited over the graphene channel 18 in the second area to increase radiation absorption. As mentioned above, the quantum photodetector can be sensitized to a selected range of wavelengths by utilizing semiconductor nanocrystals with a suitable bandgap. A conductive top electrode 15 may optionally be deposited over the photoactive layer 14. The top electrode 15 may be connected to external circuitry, or it may be a floating electrode.

Figure 2:
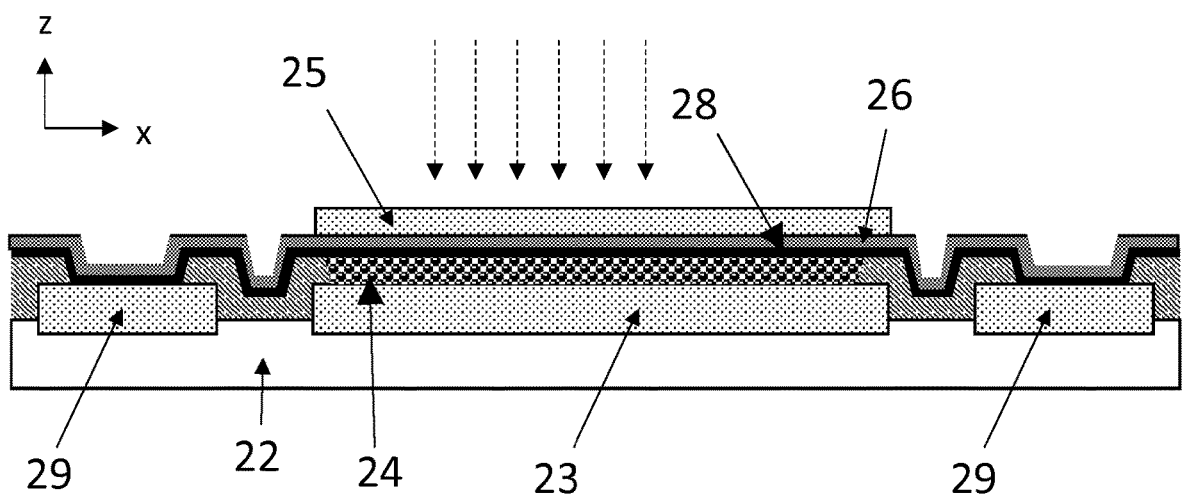

Alternatively, as illustrated in FIG. 2 the quantum photodetector may comprise a conductive bottom electrode 23 on the surface of the array substrate 22, a layer of semiconducting nanocrystals 24 which covers the bottom electrode 24 in the second area (defined by the same bottom electrode) on the array substrate 22, and a channel layer 28 of graphene which covers the layer of semiconducting nanocrystals 24. Source and drain contacts 29 may be contacted to the graphene channel 28 outside of the second area on the surface of the array substrate if the graphene channel 28 extends outside of the second area. An insulating layer 26 may cover the graphene channel, and a top electrode 25 may be deposited over this insulating layer 26.

Figure 3:
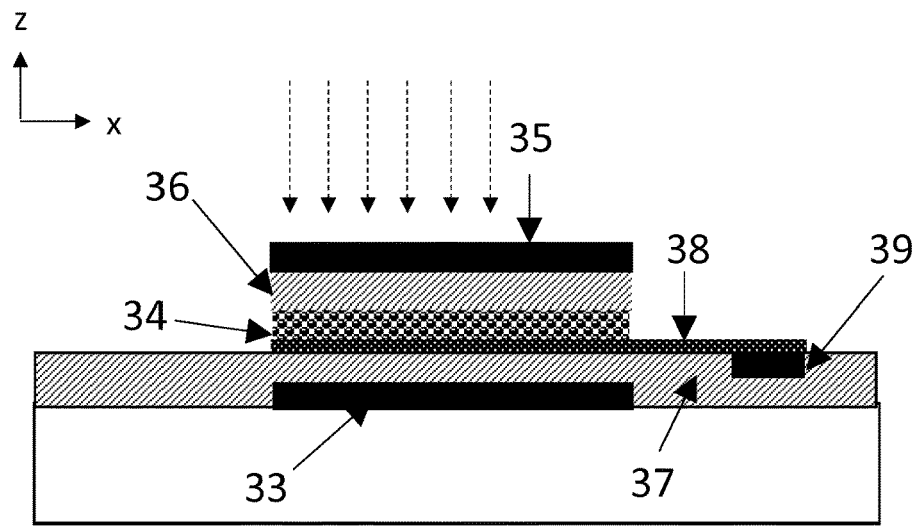

Alternatively, the quantum photodetector may be a voltage-mode device where the graphene layer forms a sensing electrode instead of a transistor channel. FIG. 3 illustrates a voltage-mode device with a gate electrode 33 on the substrate surface covered by a gate-insulating layer 37. No current is driven through the graphene layer 38, which partly covers the gate-insulating layer 37. Instead, the graphene layer 37 is utilized as a sensing electrode, and only a single-ended measurement electrode 39 needs to be connected to the graphene layer 38 to determine its potential.

As in the preceding embodiments, a photoactive layer 34 and a top electrode 35 may optionally be deposited over the graphene layer 38. A top insulating layer 36 may also optionally be placed between the photoactive layer 34 and the top electrode 35. Quantum photodetectors may also be called charge-separation photodetectors.

None of the figures in this disclosure have been drawn to scale.

The term "thermal photodetector" refers to a photodetector where incoming photons (at LWIR wavelengths, and possibly MWIR) are absorbed in a pyroelectric material, where they increase its temperature. The increased temperature (or decreased temperature, if the intensity of the incoming radiation decreases) induces a change in the electrical balance of the pyroelectric material. By placing a suitable charge-sensitive device in close proximity to the pyroelectric material, the magnitude of the electrical change can be measured in an electrical circuit connected to the charge-sensitive device. The measured variable may, for example, be the source-drain current in a transistor or the electric potential of an electrode, and this variable may be proportional to the intensity of the incident radiation. The charge sensitive device may, for example, comprise a floating electrode which is capacitively coupled to the pyroelectric material. This floating electrode may, for example, be the gate electrode of a transistor or the sensing electrode of a voltage-mode charge-sensitive device. The channel of the transistor, or the sensing electrode, may comprise a two-dimensional layered material.

The layer of pyroelectric material in the thermal photodetector may, for example, be a membrane which extends across a cavity. The cavity insulates the radiation-sensitive areas of the pyroelectric material thermally from the underlying substrate, which acts as a heat-sink at constant temperature. The membrane may be considered thermally insulated when its thermal conductivity towards the substrate is low enough that the outflow of heat from the membrane is much smaller that the inflow of heat from typical impinging radiation, allowing the membrane to locally experience a relatively high temperature increase. Suitable pyroelectric materials include, but are not limited to, $LiNbO_3$, $LiTaO_3$ and lead zirconate (PZT). The first two are typically available as bulk single crystals. PZT can for example be grown by sputtering. Thermal photodetectors may also be called bolometers.

Figure 4A:
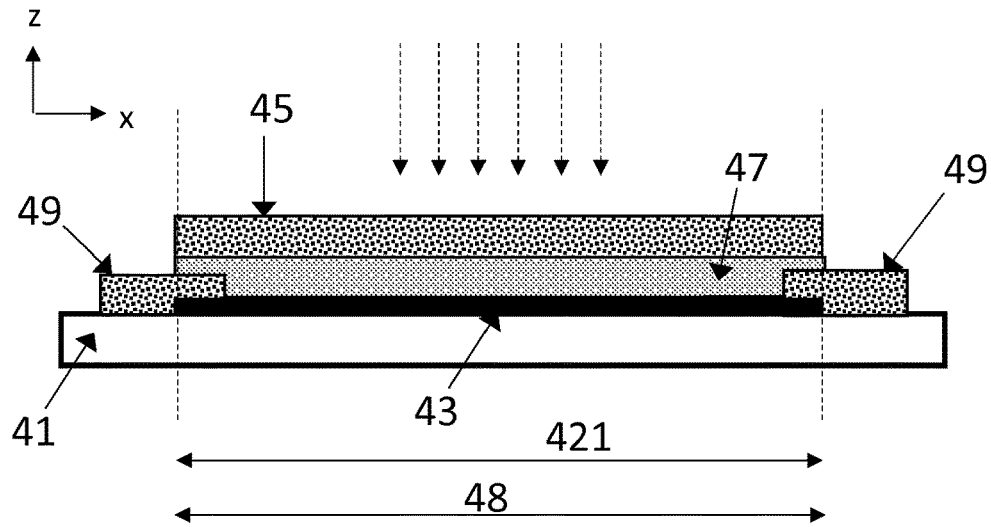
FIGS. 4a-4b illustrate a thermal photodetector.
Figure 4B:
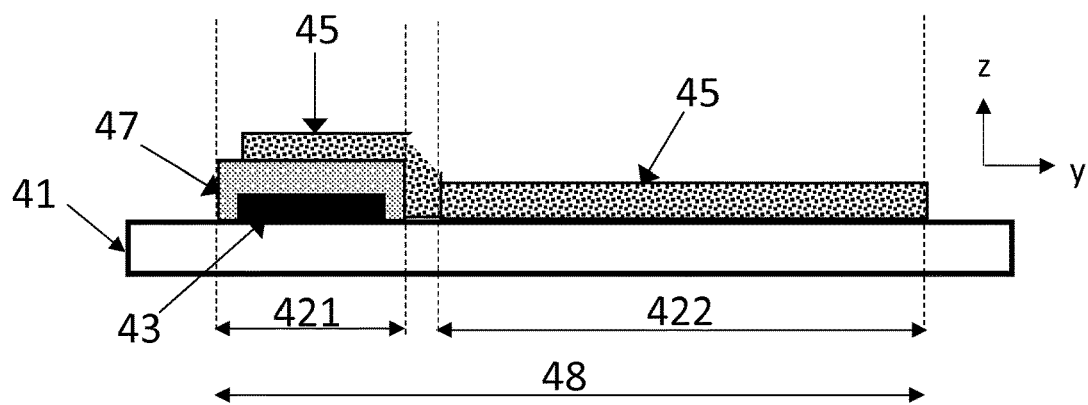

FIGS. 4a and 4b illustrate one example of a thermal photodetector from two different perspectives. The photodetector comprises a layer of graphene 43 deposited on a layer of pyroelectric material 41. Source and drain contacts 49 drive a current through the graphene channel 43. The graphene channel 43 is covered by an insulating layer 47 in the transistor area 421. A top electrode 45 covers the insulating layer 45 in the transistor area and forms the gate contact of the transistor. When the device is in operation, the top electrode 45 may be electrically floating, i.e. not set to any specific electric potential. The top electrode 45 is then free to interact electrically with the pyroelectric material.

As illustrated in FIG. 4b (where the source and drain electrodes have been omitted for clarity), the top electrode 45 extends from the transistor area 421 to an adjacent area 422 where the top electrode layer is in direct contact with layer of pyroelectric material 41. The adjacent area 422 may be larger than the transistor area 421.

When incoming radiation is absorbed in the pyroelectric material 41 (or in any additional absorbing layer which may optionally be in contact with the pyroelectric material), the local temperature is increased and the spontaneous polarization of the pyroelectric material changes in response. The portion of the top-electrode 45 which lies on area 422 charges up to screen the change in charge density that occurred on the surface of 41. Since the top electrode 45 is a floating electrode structure with net charge neutrality, the charge on 422 must come from 421, i.e., from the capacitor formed by the part of top electrode 45 which forms the top gate in the transistor structure. Since the area of 422 is designed to be larger than 421, but the charge in both regions is equal in module, the resulting electric field in transistor area 421 is much larger than that produced by the pyroelectric in the adjacent area 422. The top electrode 45 can thus be seen as a charge concentrator. The function of the graphene field-effect transistor is to read out such concentrated charge (with gain) as a change in its electrical resistance.

The expression "first area" may in this disclosure refer to an area which comprises both the transistor area 421 and the adjacent area 422 illustrated in FIGS. 4a and 4b, for example area 48. It should be noted that the transistor area 421 and the adjacent area 422 refer to the electrically active components of a thermal photodetector, while the expression "first area" refers to the foundation of the thermal photodetector, which is a layer of pyroelectric material which extends horizontally across a cavity. Since the electrically active parts of the thermal photodetector are not necessarily coextensive with the pyroelectric layer 41 (as illustrated in FIGS. 4a and 4b), the first area may extend beyond the transistor area 421 and the adjacent area 422. In some cases, the top electrode 45 could extend beyond first area 48. Nevertheless, the areas 421 and 422 where the top electrode 45 forms an electrically active component of the thermal photodetector are always contained within the first area.

The spectral sensitivity of thermal photodetectors may to some extent be tailored with antennas.

In this disclosure, graphene is used as an example of a two-dimensional layered material. However, other two-dimensional layered materials, such as phosphorene (black phosphorous), silicene, germanene, stanene, GaN, InN, InP, InAs, BAs, BP, or GaP, may also be used in any embodiment presented in this disclosure. Furthermore, the two-dimensional layered material used in any embodiment presented in this disclosure may also be a transition metal dichalcogenide or transition metal oxide, which includes $WE_2$, $MoE_2$, $ScE_2$, $TiE_2$, $HfE_2$, $ZrE_2$, $VE_2$, $CrE_2$, $MnE_2$, $FeE_2$, $CoE_2$, $NiE_2$, $NbE_2$, $TcE_2$, $ReE_2$, $PdE_2$, or $PtE_2$, where E is O, S, Se or Te. The two-dimensional layered material may comprise 1-10 atomic layers, with the total thickness ranging from 0.3 nm to 10 nm.

When prepared as two-dimensional layered materials with semiconducting, or semimetal, or metal properties, all of these materials can be used as illumination-sensitive components in quantum photodetectors and thermal photodetectors in the manner described above.

The photoactive semiconducting layer may, for example, comprise semiconductor nanocrystals or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ti_2O_3$, $Ag_2S$, $Ag_2Se$, HgTe, HgCdTe, HgS, HgSe, GaSe, GaAs, $MoS_2$, $WS_2$, ClS, InAs, InSb, InP, Ge, Si, graphene, or core/shell nanocrystals with any of the preceding core/shell constituents. Semiconductor nanocrystals will be used as the primary example of a photoactive material in this disclosure.

Alternatively, the photoactive semiconducting layer may comprise any of the preceding semiconductor nanocrystals or colloidal quantum dots embedded in a host material comprising metal chalcogenide, metal halide, or hybrid halide perovskite. The metal chalcogenide may have the general formula MEN, where E is S, Se or Te, and it may for example be $AsE_n$, $CdE_n$, $CuE_n$, $ZnE_n$, $SnE_n$, $SbE_n$, $InE_n$, $MoE_n$, or $BiE_n$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may, for example, be in the range 2-20 nm. The photosensitive semiconductor materials may provide substantial optical absorption in the wavelength range of 0.2-5 μm, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

The photoactive layer may alternatively be a thin-film semiconducting layer with a crystalline or amorphous structure. The thin-film semiconducting layer may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ti_2O_3$, $Ag_2S$, $Ag_2Se$, HgTe, HgCdTe, HgS, HgSe, GaSe, GaAs, $MoS_2$, $WS_2$, ClS, InAs, InSb, InP, Ge, or Si.

Foundations of a Thermal Photodetector

Step b) of the method, where the foundation of the thermal photodetector is prepared in the first area on the horizontal surface of the array substrate, may comprise bonding a bulk pyroelectric material to the horizontal surface of the array substrate, thinning the bulk pyroelectric material to a thin layer of pyroelectric material by grinding and mechanical polishing, and patterning the thin layer of pyroelectric material by etching.

Alternatively, step b) may comprise deposition of a layer of pyroelectric material on a first surface of a transfer substrate, bonding the first surface of the transfer substrate to the horizontal surface of the array substrate, removing the transfer substrate by polishing or etching, and patterning the layer of pyroelectric material by etching.

A CMOS substrate with vertical electrically conducting vias will be presented as an example of an array substrate in the following illustrations. This substrate may be a multi-layered substrate with a stack of active circuitry layers separated by insulating layers beneath the photodetector array. Some of the electrically conducting vias may, for example, provide resistive or capacitive contacts to the photodetector devices on top of the substrate. In other words, the conductive gate electrode or bottom electrode layers 13, 23, 33 illustrated in FIGS. 1-3 may in this case be replaced by vertical conductive vias. An insulating layer deposited over the top end of a conductive via may then, for example, serve as a gate-insulating layer.

The array substrate may alternatively have a simpler structure. It may, for example, be a silicon wafer with electrically conducting contacts deposited on the front surface where the photodetectors are manufactured, as in FIGS. 1-3.

Figure 5A:
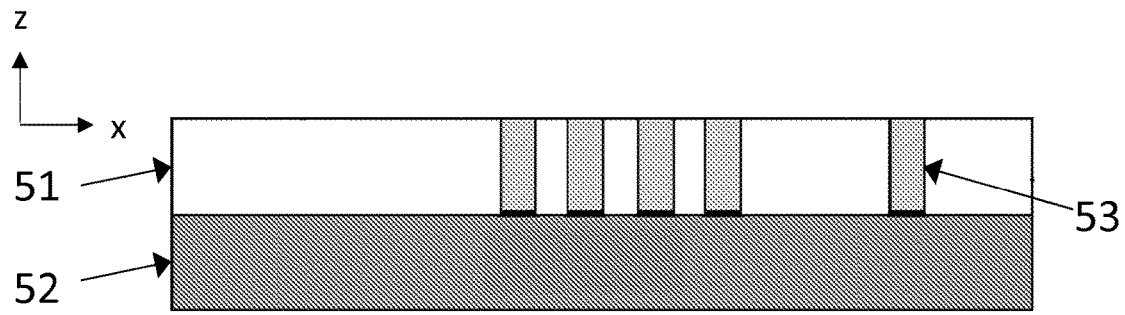
FIGS. 5a-5i illustrate methods for manufacturing the foundation of a thermal photodetector on an array substrate.
Figure 5B:
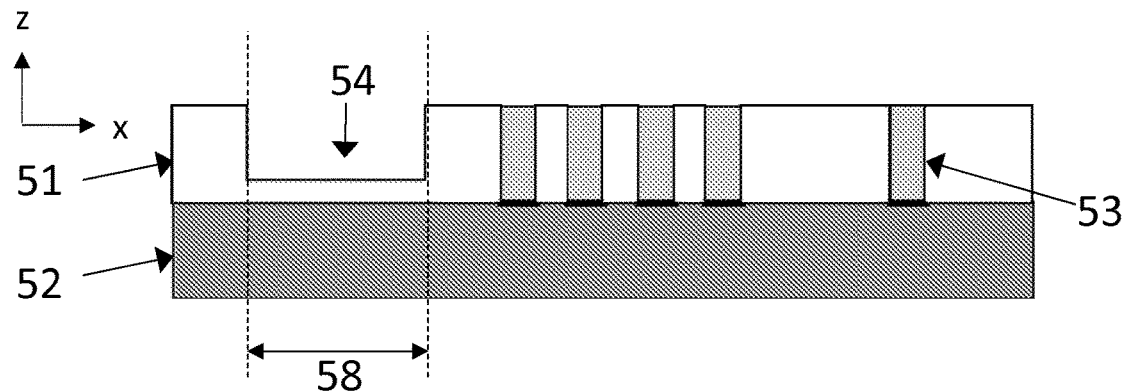

FIG. 5a illustrates a two-part array substrate with an insulating layer 51 and an underlying active circuitry layer 52. Vertical vias 53 extend from the top surface of the substrate through the insulating layer 51 to the active circuitry layer 52. The top surface is the horizontal surface of the array substrate. FIG. 5b illustrates step a) of the method, where a vertical cavity 54 is etched in a first area 58 on the horizontal surface of the array substrate. Dry or wet oxide etching with a sacrificial hard mask may be used to prepare the cavity 54. The depth of the cavity may, for example, range from 1 μm up to several tens of micrometers. The cavity 54 should typically not extend to the active circuitry layer 52 if it contains tightly packed electric circuitry. A back reflector layer (not illustrated) may optionally be deposited on the bottom of the cavity 54.

Figure 5C:
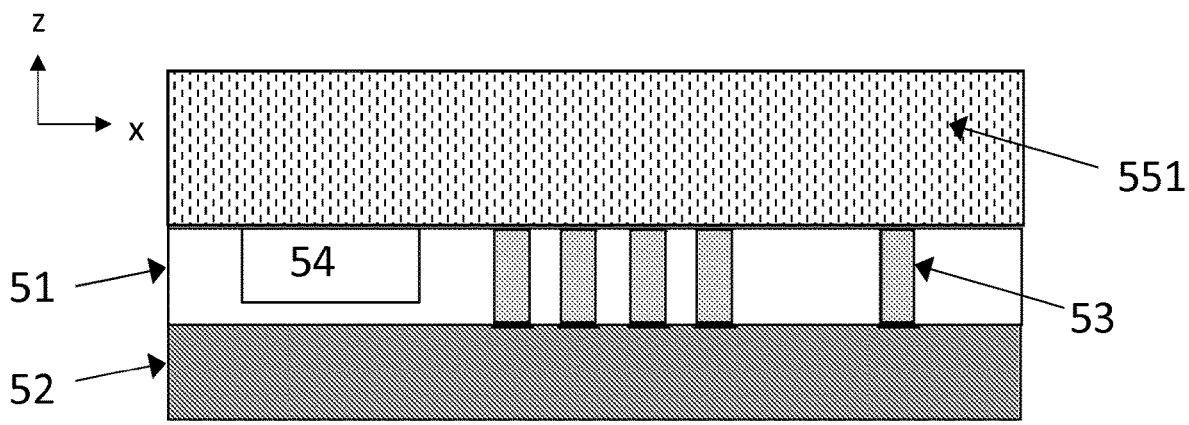
Figure 5D:
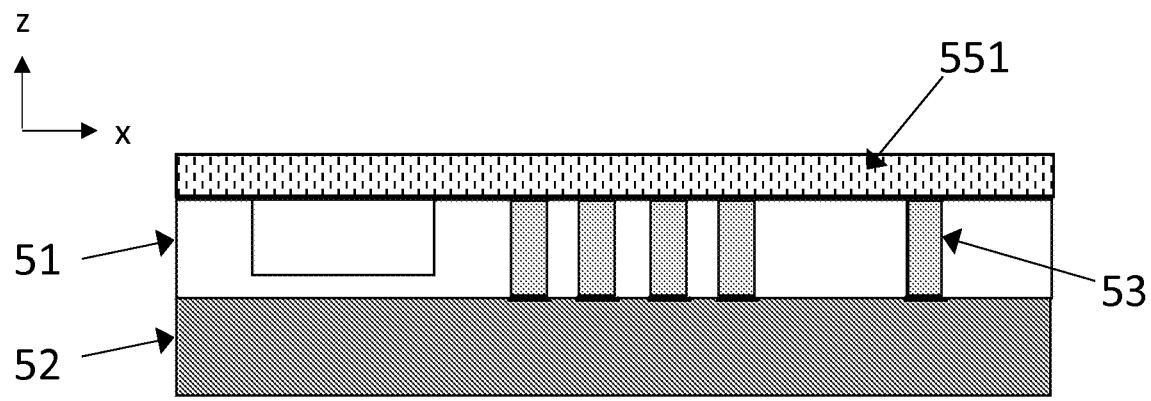
Figure 5E:
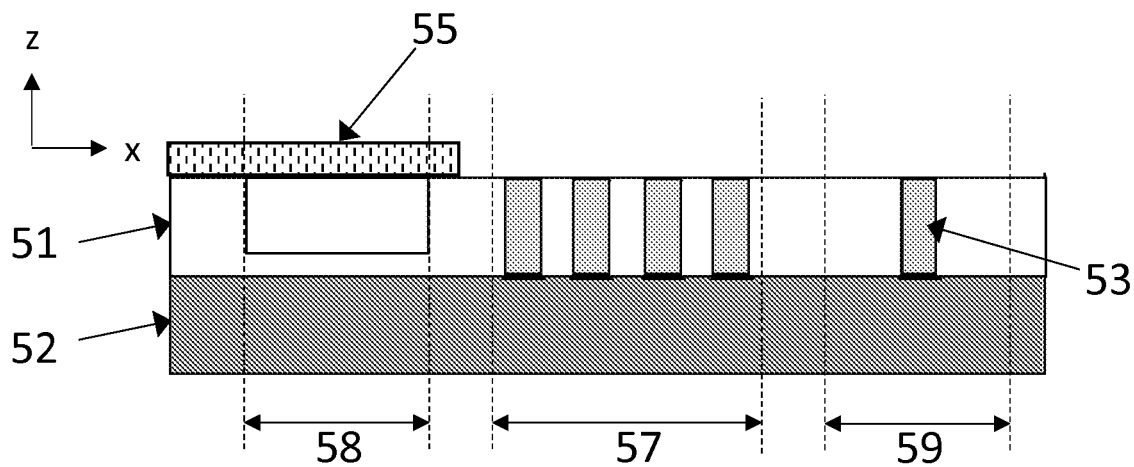
Figure 5F:
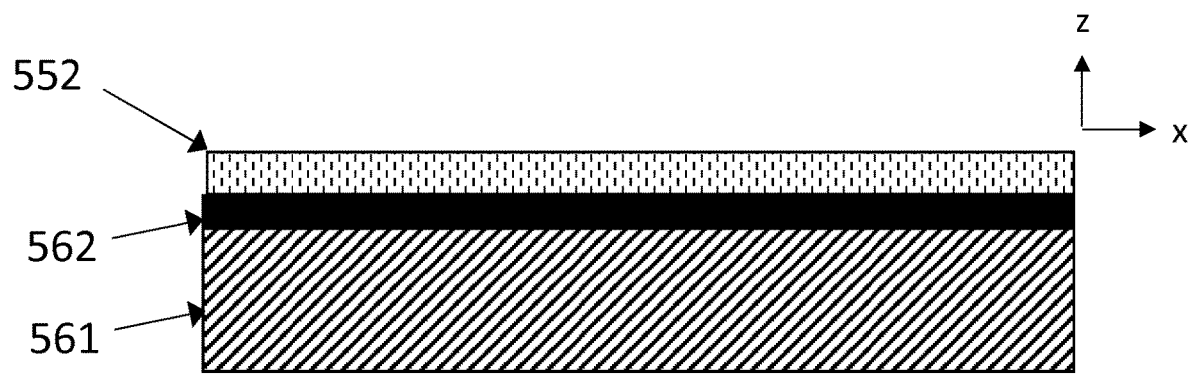

FIGS. 5c-5e illustrate a first embodiment of step b) in the manufacturing method. In FIG. 5c, a bulk wafer of pyroelectric material 551 has been bonded to the array substrate so that it at least extends across the cavity 54. The bonding may be covalent, or it may be achieved using an adhesive. The thickness of the bulk wafer 551 may, for example, be close to 500 μm. The bulk wafer 551 is then thinned by grinding and mechanical polishing to a thickness of a few tens of micrometers. The thinned layer of pyroelectric material 551 is illustrated in FIG. 5d.

In FIG. 5e, the layer of pyroelectric material 55 has been etched, for example in a dry etching process based on $SF_6$ and $Ar/O_2$. Pyroelectric material has been removed at least from the second area 59 where the quantum photodetector will later be prepared and from other areas of the substrate, such as 57, where electrical contacts may later be prepared. In other words, the layer of pyroelectric material 55 covers at least the first area 58 on the array substrate, and may also extend outside of the first area, as illustrated in FIG. 5e. But the layer of pyroelectric material 55 does not in this case extend to the second area 59.

In other words, the first area 58 may be defined by a cavity 54 which is covered in its entirety by the pyroelectric material 55. The transistor area 421 and the adjacent area 422 (not illustrated in FIG. 5e) are contained within the first area 58, but the source and drain contacts typically extend beyond the first area in the horizontal xy-plane, and the top electrode may do so as well.

Figure 5G:
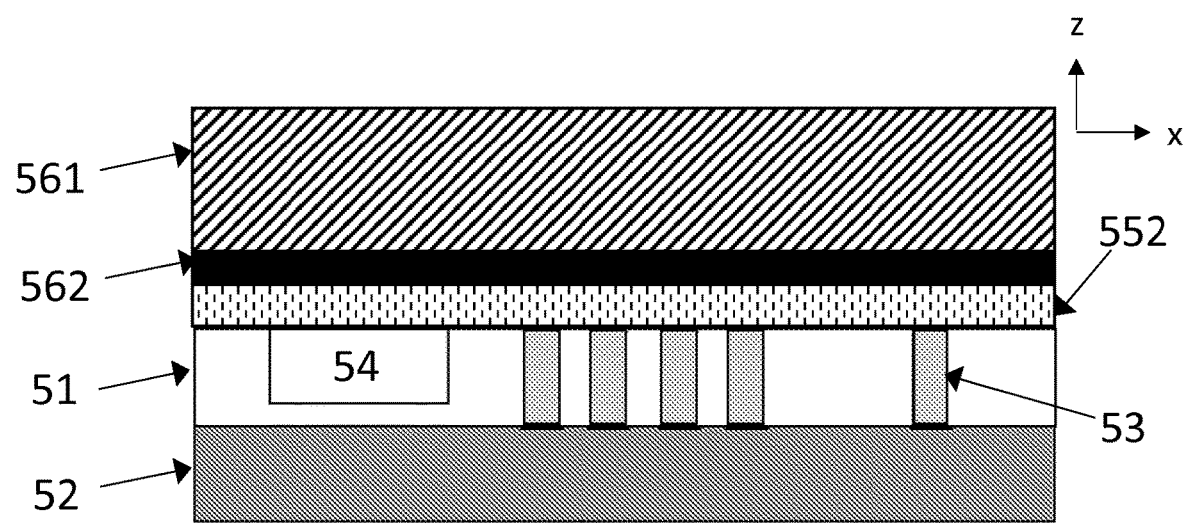
Figure 5H:
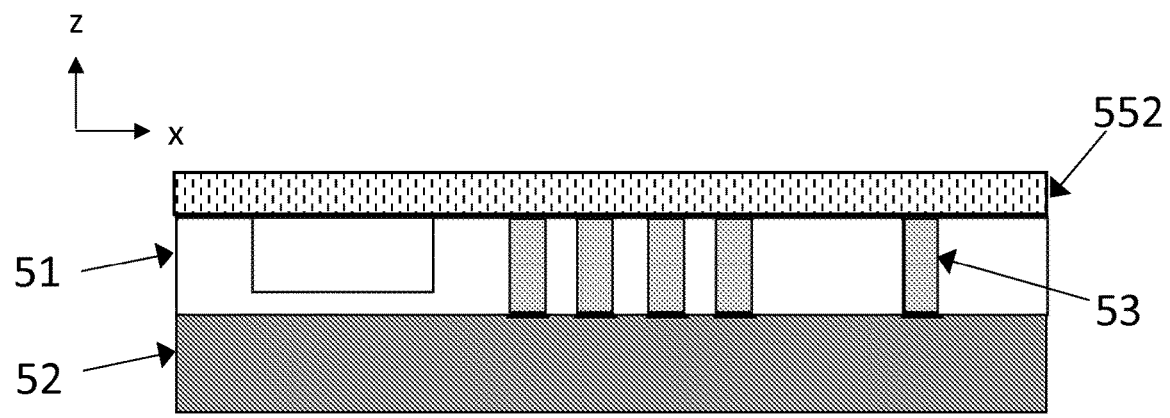
Figure 5I:
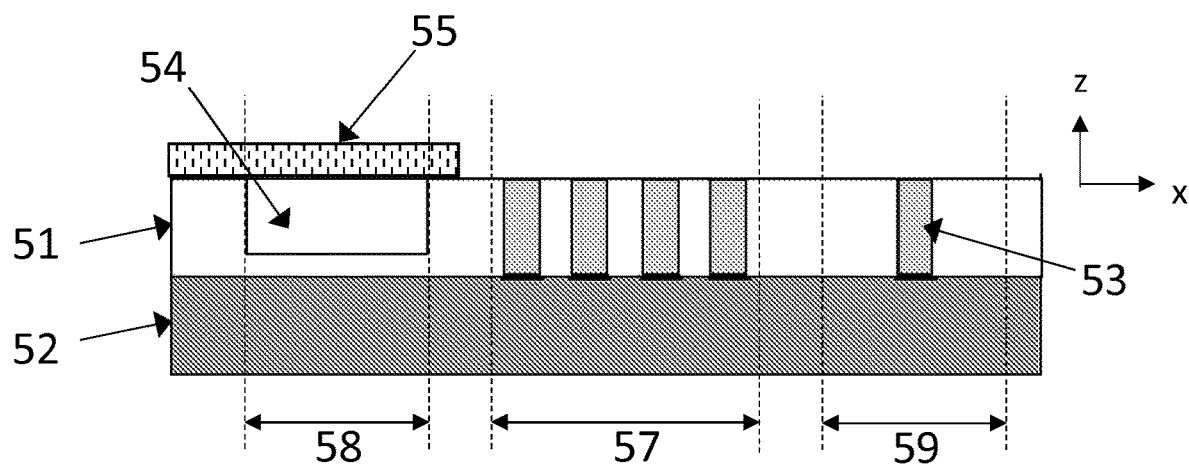

FIGS. 5g-5i illustrate a second embodiment of step b) in the manufacturing method. This embodiment includes the steps illustrated in FIGS. 5a and 5b for preparing the array substrate. A layer of pyroelectric material 552 is then either grown on a transfer substrate or transferred to the transfer substrate as a bulk wafer and then sliced, polished and annealed. The transfer substrate may be a silicon substrate 561 with a thin silicon dioxide layer 562 on top.

In FIG. 5g, the transfer substrate has been bonded face-down on the array substrate prepared in FIGS. 5a-5b, either by covalent bonding or by using an adhesive. The transfer substrate 561/562 is then etched away completely, leaving only the layer of pyroelectric material 552 on the array substrate, as illustrated in FIG. 5h. The layer of pyroelectric material 552 may then be patterned so that only that part 55 of the layer which spans the cavity 54 in the first area 58 is left, as illustrated in FIG. 5i.

The preparation of a foundation for the thermal photodetector has been completed in the structures illustrated in FIGS. 5e and 5i, where the layer of pyroelectric material 55 extends over the cavity 54.

Foundations of a Quantum Photodetector

Step c) of the method, where the foundation of the quantum photodetector is prepared in a second area of the horizontal surface of the array substrate, may comprise deposition of a conductive electrode layer in the second area, and deposition of an insulating layer which covers the conductive electrode layer in the second area, so that the foundation of the quantum photodetector comprises a conductive electrode layer covered by an insulating layer. This option will not be separately illustrated. The quantum photodetector may in this case be a field-effect transistor, and the conductive electrode may form the gate electrode in the transistor.

In the illustrated alternative, the array substrate comprises at least one vertical conductive via in the second area, so that the vertical conductive via forms an electrical connection between the horizontal surface and circuitry inside the array substrate, step c) may comprise deposition of an insulating layer which covers the vertical conductive via in the second area, so that the foundation of the quantum photodetector comprises a conductive via covered by an insulating layer. In this case, the quantum photodetector may be a field-effect transistor, and the conductive via in the second area may form the gate electrode in the transistor.

Figure 6A:
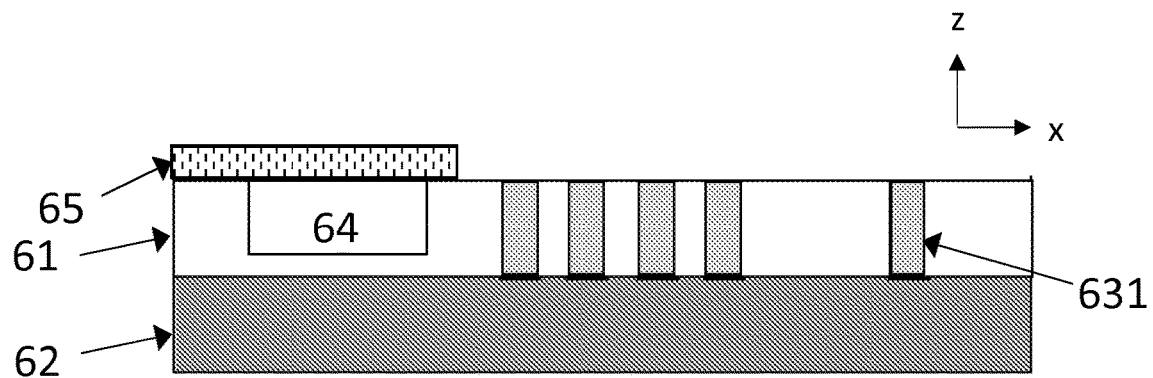
FIGS. 6a-6c illustrate methods for manufacturing the foundation of a quantum photodetector on an array substrate.
Figure 6B:
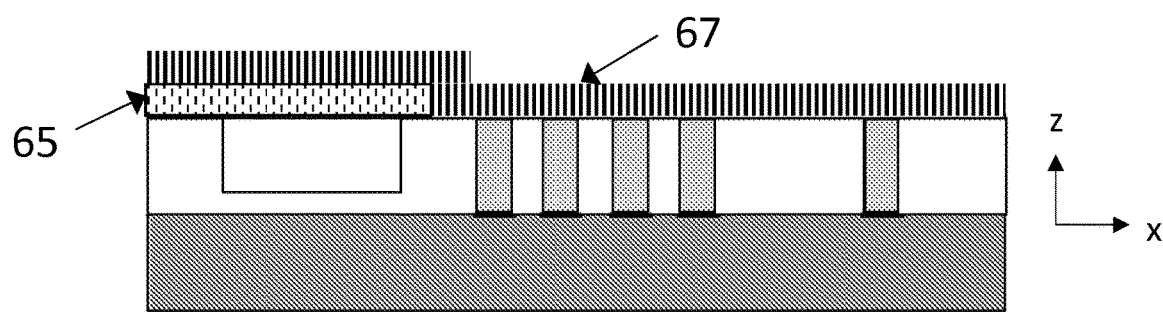
Figure 6C:
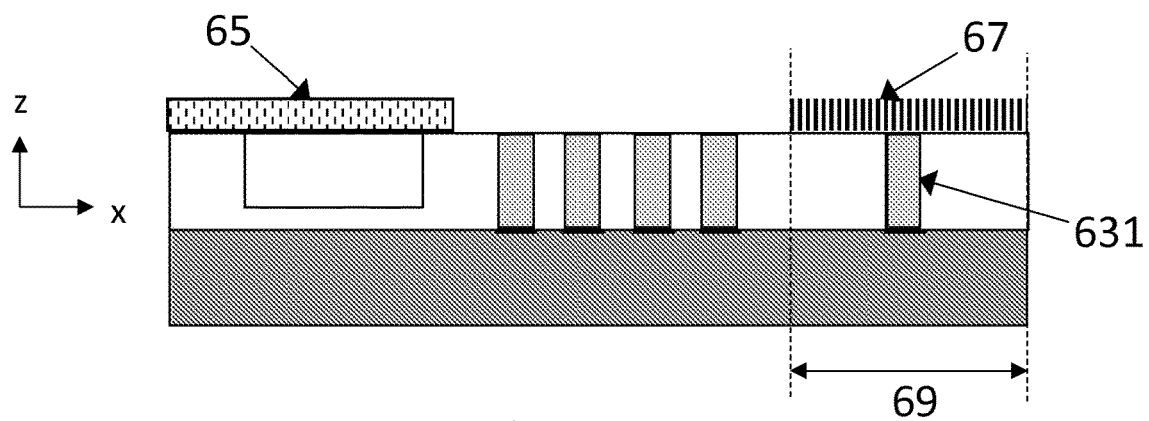

FIG. 6a illustrates an array substrate which may correspond to either of the array substrates illustrated in FIGS. 5e and 5i. References 61-62, 64-65 and 69 correspond to reference numbers 51-52, 54-55 and 59, respectively, in FIGS. 5a-5i. The conductive via 631 may form the gate electrode in a field-effect transistor. In FIGS. 6b-6c, an insulating layer 67, such as $Al_2O_3$, is deposited and patterned on the array substrate so that it covers the second area 59 on the horizontal surface of the array substrate. Insulating layer 67 also covers the gate electrode 631.

In some cases, step c) may comprise the deposition of a photoactive semiconducting layer in the second area, so that the foundation of the quantum photodetector comprises a photoactive semiconducting layer. The photoactive semiconducting layer may cover a conducting electrode in the second area.

Deposition and Patterning of Two-Dimensional Material

Figure 6D:
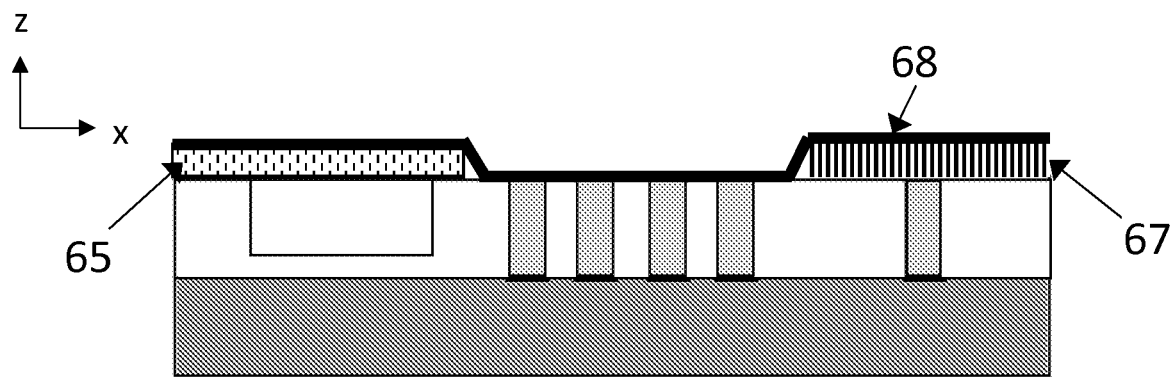
FIGS. 6d-6h illustrate methods for completing the manufacturing of the thermal photodetector and the quantum photodetector.
Figure 6E:
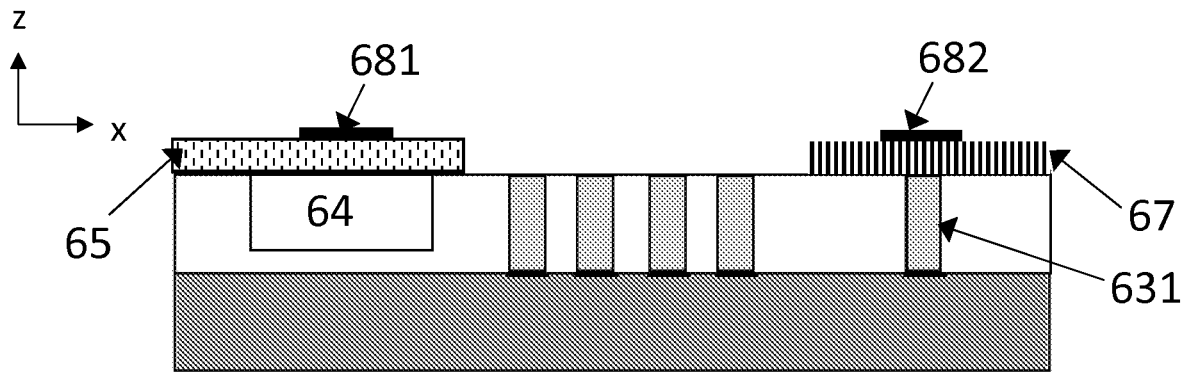

In FIG. 6d, which corresponds to step d), one layer of two-dimensional layered material 68, for example graphene, has been deposited on the horizontal surface of the array substrate, so that it covers at least the foundation of the thermal photodetector in the first area and the foundation of the quantum photodetector in the second area. One option is to deposit a continuous graphene layer 68 over the entire surface of the array substrate. In FIG. 6e, which corresponds to step e), the graphene layer has been patterned into two separate parts, so that a first part of the layer 681 covers at least a part of the foundation of the thermal photodetector, and a second part 682 of the covers at least a part of the foundation of the quantum photodetector. When comparing FIGS. 6d and 6e, it can be seen that the first and second parts of the graphene layer 681 and 682 are located some distance from the vertical steps formed by the edge of pyroelectric material 65 and the gate-insulating layer 67, where discontinuities in the graphene layer may be formed in deposition.

All photodetectors on the array substrate which include a layer of two-dimensional material as an electrically active component can thereby receive this layer in the same deposition and patterning process. This reduces the number of processing steps and the failure rate. Depositing a separate graphene layer for each photodetector type would make the manufacturing process more complex and increase material and labour costs.

Figure 6F:
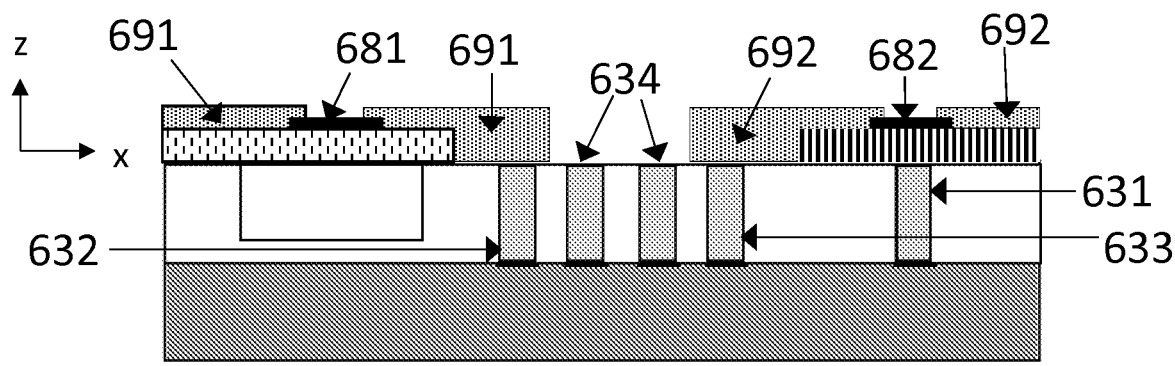

In FIG. 6f, electrical contact areas 691 and 692 have been deposited and patterned on the horizontal surface of the array substrate to provide electrical connections to the thermal photodetector and the quantum photodetector. As illustrated in FIG. 6f, the contact areas 691 and 692 may extend outside of the first area and second area, respectively, so that they reach conductive vias 632 and 633 which connect the photodetectors to external measurement circuitry. Other conductive vias 634 may still be left vacant.

Completion of Thermal Photodetector

The quantum photodetector in FIG. 6f is an operational photodetector even without a photoactive layer, so it does not necessarily need any further components. The second part of the graphene layer 682 functions as the transistor channel between source and drain electrodes 692.

Figure 6G:
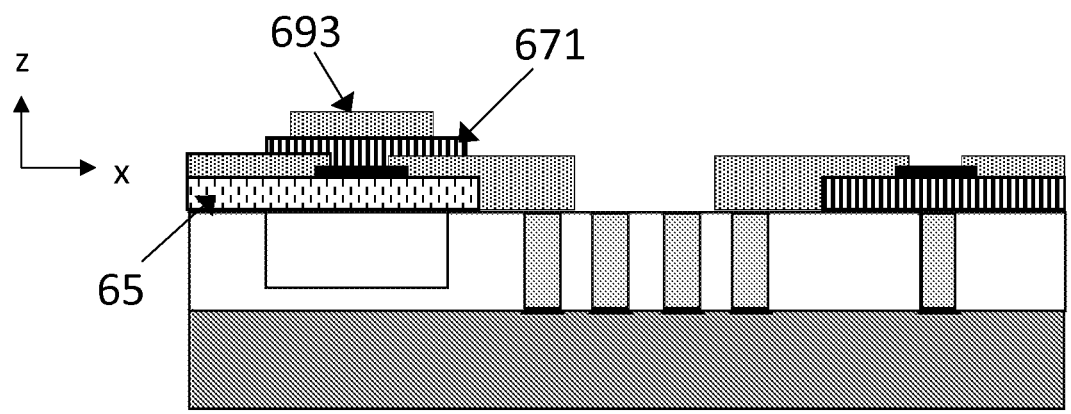

The thermal photodetector still needs a top electrode to generate irradiation-dependent capacitive coupling between the pyroelectric material and the transistor structure on the foundation of the thermal photodetector. In FIG. 6g, the first part of the graphene layer 681 has been covered by a top insulating layer 671. A top electrode 693 covers the insulating layer 671 at least in the area which overlies the graphene channel 681. The top electrode extends from the transistor area illustrated I FIG. 6g to an adjacent area where the top electrode is in direct contact with the thin layer or pyroelectric material. The thermal photodetector is thereby also operational in the structure illustrated in FIG. 6g.

Alternative Foundation for the Quantum Photodetector

It may in some cases be preferable to build the foundation of the quantum photodetector on the layer of pyroelectric material. The stack of materials in the second area of the surface of the array substrate then includes also the layer of pyroelectric material. In this case, there is no need to remove all sections of the layer of pyroelectric material which lie outside of the first area (and its surroundings) after it has been attached to the array substrate. Instead, the layer of pyroelectric material may extend under the quantum photodetector, possibly across multiple adjacent pixels, and the patterning of the layer of pyroelectric material may comprise only the etching of vertical trenches for making electrical connections to underlying structures.

The benefits of this approach may include that less time-consuming etch processes can be used in the patterning of the pyroelectric layer and that the two-dimensional material can be deposited on a surface without sharp edges or high vertical steps. Such edges and steps may sometimes be present at the edges of the layer of pyroelectric material if it is patterned to lie only in the first area and its surroundings, but not in the second area.

In a method for producing a photodetector according to this embodiment, after step b) the layer of pyroelectric material also extends across the at least one second area. Step c) then comprises first the deposition of an additional insulating layer over the pyroelectric material in the at least one second area of the horizontal surface of the array substrate, then the deposition of a conductive gate electrode layer over the additional insulating layer in the at least one second area of the horizontal surface of the array substrate, and then the deposition of a gate insulating layer over the conductive gate electrode layer in the at least one second area of the horizontal surface of the array substrate. Step f) then comprises the further step of providing electrical connections also to the conductive gate electrode layer.

Figure 7A:
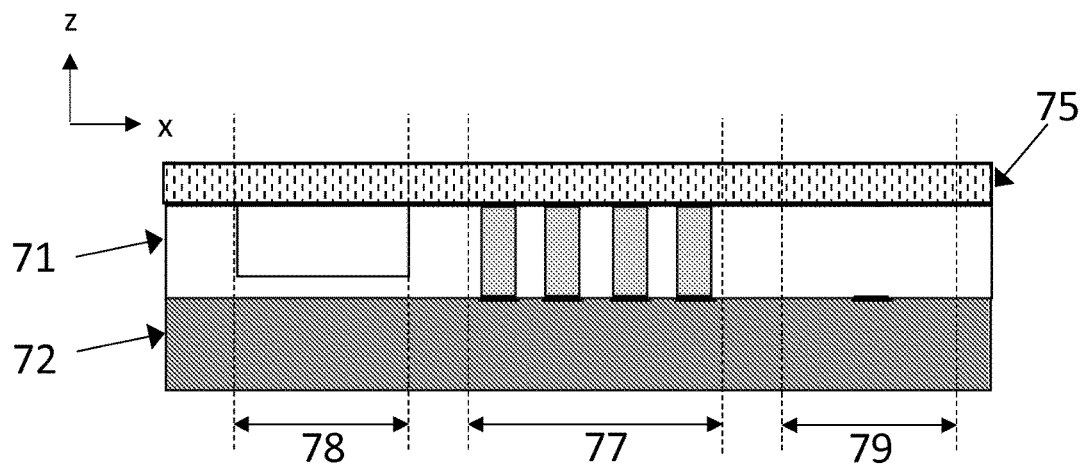
FIGS. 7a-7c illustrate an alternative method for manufacturing the foundation of a thermal photodetector and a quantum photodetector on an array substrate.
Figure 7B:
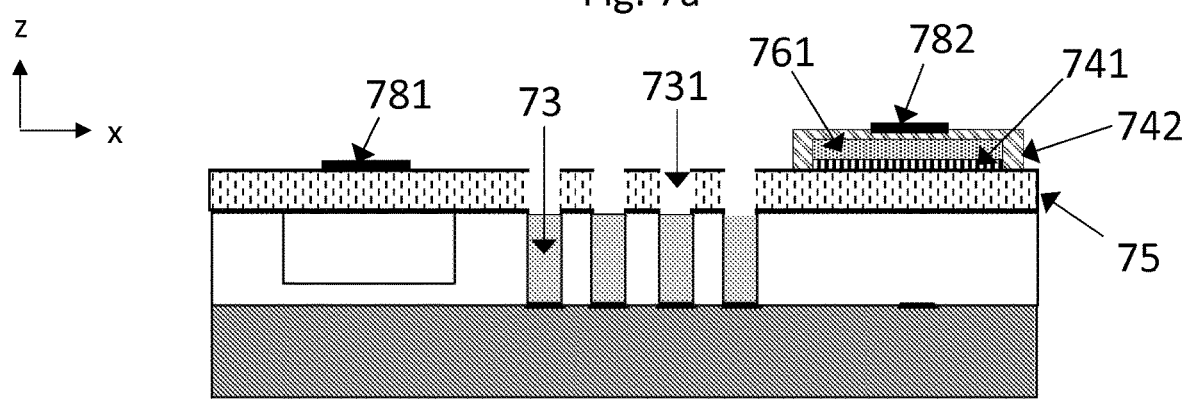
Figure 7C:
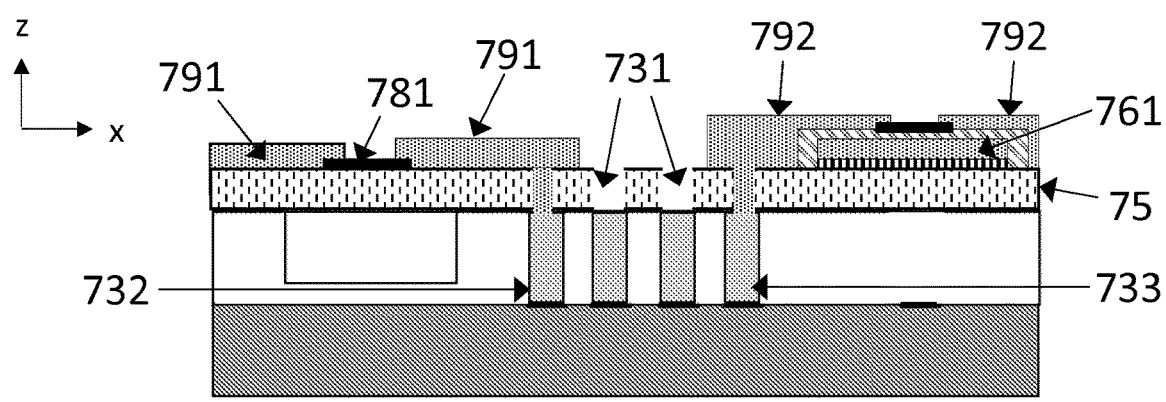

FIGS. 7a-7c illustrate this method in more detail. Reference numbers 71, 72, 75 and 77-79 correspond to reference numbers 51, 52, 55 and 57-59, respectively, in FIGS. 5a-5i. FIG. 7a corresponds to FIGS. 5d and 5h, and the layer of pyroelectric material 75 may have been attached to the array substrate 71/72 with either of the methods that preceded those two figures. However, in this case the layer of pyroelectric material 75 extends across the array substrate so that it covers the array substrate in the first area 78, second area 79 and the additional area 77.

The foundation of the quantum photodetector is then prepared on top of the layer of pyroelectric material in the second area 79. An additional insulating layer 741 may first be deposited on the layer of pyroelectric material 75, and a conductive gate electrode layer 761 may then be deposited over this additional insulating layer 74. This gate electrode may form the bottom gate of the phototransistor. A gate insulating layer 742 may then be deposited in the second area so that it covers both the conductive gate electrode layer 761 and the additional insulating layer 741. In this case the gate insulating layer 742 performs the same function as layer 67 in FIG. 6d, and the conductive gate electrode 761 performs the same function as the conductive via 631 in FIG. 6d.

The pyroelectric material may then be patterned to form trenches 731 which reach down to the electric vias 73 in the array substrate. These trenches 731 may have an elongated shape, and they may extend across the entire layer of pyroelectric material 75. Alternatively, the trenches may have a circular or rectangular pattern and they may surround either the first area or the second area on the surface of the array substrate. The trenches 731 may alternatively be wells which have approximately the same dimensions in the xy-plane as the underlying electric via 73.

As in FIGS. 6d-6e, the layer of two-dimensional material is then deposited and patterned in both the first and the second areas of the horizontal surface of the array substrate, so that a first part 781 of this layer covers a part of the foundation of the thermal photodetector and a second part 782 covers a part of the foundation of the quantum photodetector, as FIG. 7b illustrates.

These two steps, patterning of the pyroelectric material and deposition and patterning of the two-dimensional material, can be completely separate. Alternatively, a layer of two-dimensional material may first be deposited over the entire layer of pyroelectric material 75 in FIG. 7a. A first masking layer (not illustrated) may then be prepared on the two-dimensional material and trenches 731 may be etched through both the layer of two-dimensional material and the pyroelectric material 75. A second masking material (not illustrated) may then again be prepared on the layer of two-dimensional material for patterning the first part 781 and the second part 782.

Electric connections 791 and 792 may then be provided to the first and second parts 781 and 782 of the two-dimensional layer in the same manner as in FIG. 6f, with the difference that the contacts 791 and 792 now extend into trenches 731 formed in the pyroelectric material so that they can make contact with vertical vias such as 732 and 733. Furthermore, since the gate electrode 761 is not in this case in itself a vertical via as the electrode 631 in FIG. 6f, an additional electrical connection must now also be provided to the gate electrode layer 761. This additional electrical connection is not illustrated in FIG. 7c, but it may for example be routed in the y-direction to an adjacent trench in the pyroelectric material and an underlying vertical via.

The thermal photodetector is then completed in the manner described above with reference to FIG. 6g, and the quantum photodetector may optionally be processed in the manner described below with reference to FIG. 6h.

In the resulting apparatus, the layer of pyroelectric material 75 extends horizontally also across the second area 79 of the horizontal surface of the array substrate 71/72, and the foundation of the quantum photodetector comprises (i) an additional insulating layer 741 on top of the layer of pyroelectric material 75, (ii) a conductive gate electrode layer 761 on top of the additional insulating layer, and (iii) a gate insulating layer 742 on top of the conductive electrode layer 761, all (i-iii) on the second area of the horizontal surface of the array substrate.

Optional Processing

The efficiencies and spectral responsivities of quantum photodetectors on the array substrate can be further improved and tailored with the use of photoactive layers, as described above. In particular, the second part of the layer of two-dimensional material in the quantum photodetector may be covered by a semiconductive photoactive layer.

Figure 6H:
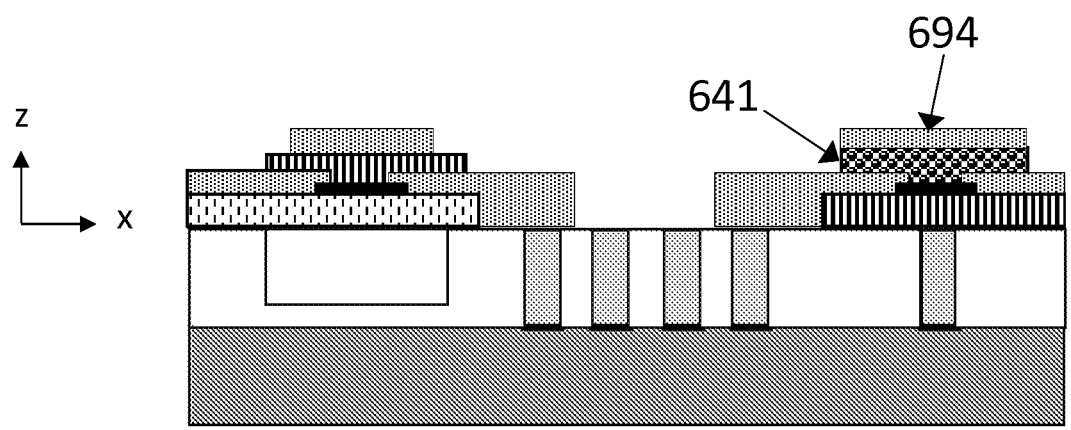

In FIG. 6h, the graphene channel 682 in the quantum photodetector has been covered with a layer of semiconducting nanocrystals 641 and a top electrode 694.

It is often desirable to use multiple photodetectors in the same photodetector array, and to sensitize different quantum photodetectors in the array to separate wavelength bands. One set of quantum photodetectors may for example be sensitized to UV, another set to VIS, another to SWIR and another set to MWIR. FIGS. 8a-8g illustrate one example of a process for sensitizing quantum photodetectors to different wavelengths (thermal photodetectors may be present on the same array substrate, but they can be unaffected by the processes illustrated in FIGS. 8a-8g and are therefore not illustrated). For simplicity, only two adjacent quantum photodetectors sensitized to two different wavelength bands will be illustrated. The process can be generalized to larger numbers of quantum photodetectors and more wavelength bands in a straightforward manner.

Figure 8A:
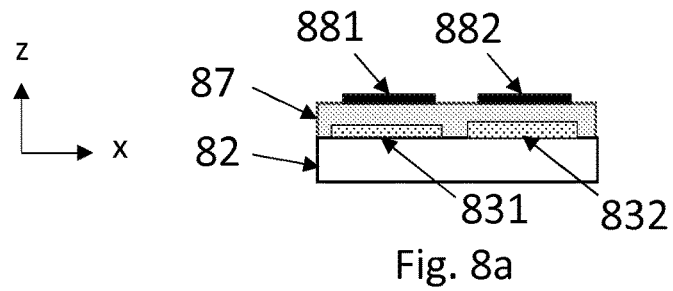
FIGS. 8a-8g illustrate a method for sensitizing quantum photodetectors to different wavelength bands.
Figure 8B:
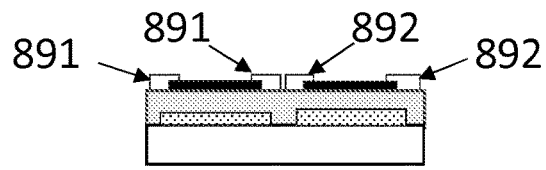
Figure 8C:
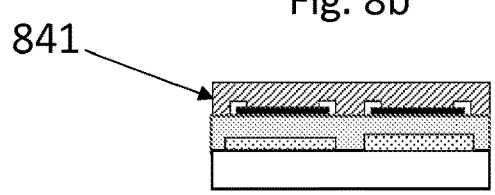
Figure 8D:
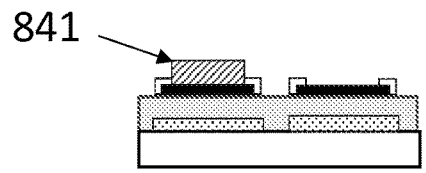
Figure 8E:
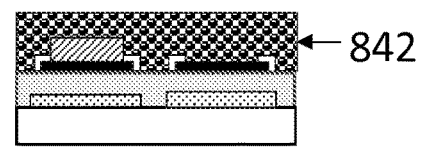

FIG. 8a illustrates an array substrate 82 with two gate electrodes 831 and 832, a gate-insulating layer 87, which in this case covers both gate electrodes, and a first graphene channel 881 and second graphene channel 882 on the gate-insulating layer 87. In FIG. 8b, source and drain contacts 891 and 892 have been deposited at the ends of the first and second graphene channels 881 and 882, respectively.

The quantum photodetector on the left will be sensitized to NIR and SWIR wavelengths. A first layer of semiconductor nanocrystals 841 is therefore deposited on the array substrate in FIG. 8c, for example by spin coating, and patterned in a lithographic process in FIG. 8d so that it covers the first graphene channel 881. The material in layer 841 may, for example, be colloidal PbS quantum dots with the absorption peak at 2000 nm, suitable for absorbing light at infrared wavelengths up to 2 μm. The quantum photodetector on the right will be sensitized to VIS wavelengths. A second layer of semiconductor nanocrystals 842 is then deposited on the array substrate in FIG. 8e. This layer has been patterned in FIG. 8f in a lithographic process so that it covers the second graphene channel 882 and also the first quantum dot layer 841. The material in layer 842 may, for example, be colloidal PbS quantum dots with the absorption peak at 750 nm, suitable for absorbing light at visible wavelengths. The quantum photodetectors may then be encapsulated with an at least partly transparent encapsulant 87, as illustrated in FIG. 8g. The encapsulant may, for example, be a layer of $Al_2O_3$.

Figure 8F:
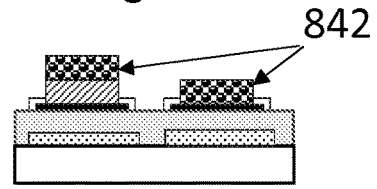
Figure 8G:
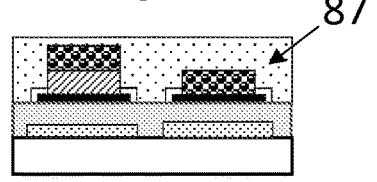

As illustrated in FIGS. 8f-8g, the quantum photodetector may comprise a stack with several layers of semiconducting nanocrystals 841, 842 with different bandgaps, so that the layer which is closest to the incoming radiation (in this case 842) has a larger bandgap than the layers below. The stack is manufactured by protecting both the first and the second quantum photodetector with a photoresist in the lithographic etching process which produces the structure shown in FIG. 8e. In some manufacturing scenarios, a lift-off patterning process may be applicable.

The invention claimed is:

1. A method for preparing a photodetector array comprising an array substrate with a horizontal surface, and at least one first sensor and at least one second sensor on the horizontal surface of the array substrate, wherein the at least one first sensor is sensitive to radiation in a first wavelength range which comprises at least long-wavelength infrared, and the at least one second sensor is sensitive to radiation in a second wavelength range which comprises wavelengths shorter than long-wavelength infrared, wherein the at least one first sensor is a thermal photodetector and the at least one second sensor is a quantum photodetector, said method comprises the following steps:
    a) etching a vertical cavity in at least one first area on the horizontal surface of the array substrate,
    b) preparing the foundation of the thermal photodetector in the at least one first area on the horizontal surface of the array substrate, wherein the preparation comprises placing a layer of pyroelectric material over the vertical cavity in the first area, so that it extends horizontally across the cavity,
    c) preparing the foundation of the quantum photodetector in at least one second area of the horizontal surface of the array substrate, wherein the preparation comprises deposition of one or more of the following layers: a gate insulating layer, a photoactive semiconducting layer, a conductive gate electrode layer,
    d) depositing a layer of two-dimensional layered material on the horizontal surface of the array substrate so that it covers the foundation of the thermal photodetector at least in a part of each first area of the horizontal surface of the array substrate, and so that it covers the foundation of the quantum photodetector at least in a part of each second area of the horizontal surface of the array substrate,
    e) patterning the layer of two-dimensional layered material into at least two separate parts, so that one or more first parts of the layer of two-dimensional layered material cover at least a part of the foundation of the thermal photodetector, and one or more second parts of the layer of two-dimensional layered material cover at least a part of the foundation of the quantum photodetector,
    f) providing electrical connections to each first and second part of the two-dimensional layered material and depositing on each first part of the layer of two-dimensional material a top insulating layer and depositing on each top insulating layer a top electrode layer which extends from a transistor area within the first area to an adjacent area within the first area, so that the top electrode layer is in direct contact with the layer of pyroelectric material in the adjacent area.

2. The method according to claim 1, wherein step b) comprises bonding a bulk pyroelectric material to the horizontal surface of the array substrate, thinning the bulk pyroelectric material to a layer of pyroelectric material by grinding and mechanical polishing, and patterning the layer of pyroelectric material by etching.

3. The method according to claim 1, wherein step b) comprises deposition of a layer of pyroelectric material on a first surface of a transfer substrate, bonding the first surface of the transfer substrate to the horizontal surface of the array substrate, removing the transfer substrate by polishing or etching, and patterning the layer of pyroelectric material by etching.

4. The method according to claim 1, wherein step c) comprises deposition of a conductive electrode layer in the second area, and deposition of an insulating layer which covers the conductive electrode layer in the second area, so that the foundation of the quantum photodetector comprises a conductive electrode layer covered by an insulating layer.

5. The method according to claim 1, wherein the array substrate comprises at least one vertical conductive via in the second area, so that the vertical conductive via forms an electrical connection between the horizontal surface and circuitry inside the array substrate, and step c) comprises deposition of an insulating layer which covers the vertical conductive via in the second area, so that the foundation of the quantum photodetector comprises a conductive via covered by an insulating layer.

6. The method according to claim 1, wherein step c) comprises the deposition of a photoactive semiconducting layer in the second area, so that the foundation of the quantum photodetector comprises a photoactive semiconducting layer.

7. The method according to claim 1, wherein after step b) the layer of pyroelectric material also extends across the at least one second area, and that step c) comprises first the deposition of an additional insulating layer over the pyroelectric material in the at least one second area of the horizontal surface of the array substrate, then the deposition of a conductive gate electrode layer over the additional insulating layer in the at least one second area of the horizontal surface of the array substrate, and then the deposition of a gate insulating layer over the conductive gate electrode layer in the at least one second area of the horizontal surface of the array substrate, wherein step f) comprises the further step of providing electrical connections also to the conductive gate electrode layer.

8. A photodetector array comprising an array substrate with a horizontal surface, and at least one first sensor and at least one second sensor on the horizontal surface of the array substrate, wherein the at least one first sensor is sensitive to radiation in a first wavelength range which comprises long-wavelength infrared wavelengths, and the at least one second sensor is sensitive to radiation in a second wavelength range which comprises wavelengths shorter than long-wavelength infrared, wherein the at least one first sensor is a thermal photodetector and the at least one second sensor is a quantum photodetector, and wherein the array substrate comprises a vertical cavity in a first area on its horizontal surface, the thermal photodetector comprises a layer of pyroelectric material which extends horizontally across the vertical cavity in the first area, a first part of a layer of two-dimensional layered material which at least partly covers the layer of pyroelectric material, one or more electrical contact areas on the array substrate which provide electrical connections to the first part of the layer of two-dimensional material, a top insulating layer on the first part of the layer of two-dimensional material, and a top electrode layer on the top insulating layer, wherein the top electrode extends from a transistor area within the first area to an adjacent area within the first area so that the top electrode layer is in direct contact with the layer of pyroelectric material in the adjacent area, the quantum photodetector comprises a foundation which includes at least one of the following layers on a second area of the horizontal surface of the array substrate: a gate insulating layer, a photoactive semiconducting layer, a conductive gate electrode layer, and the quantum photodetector also comprises a second part of the layer of two-dimensional layered material which at least partly covers the foundation of the quantum photodetector, and one or more electrical contact areas on the array substrate which provide electrical connections to the second part of the layer of two-dimensional material.

9. The photodetector array according to claim 8, wherein the array substrate is a CMOS substrate with vertical electrically conducting vias.

10. The photodetector array according to claim 8, wherein the layer of pyroelectric material also extends horizontally across the second area of the horizontal surface of the array substrate, and the foundation of the quantum photodetector comprises an additional insulating layer on top of the layer of pyroelectric material, the conductive gate electrode layer on top of the additional insulating layer, and) the gate insulating layer on top of the conductive electrode layer, all on the second area of the horizontal surface of the array substrate.

* * * * *